United States Patent
Kawai (10) Patent No.: US 7,129,150 B2
(45) Date of Patent: Oct. 31, 2006

(54) METHOD OF DIVIDING A SEMICONDUCTOR WAFER

(75) Inventor: Akihito Kawai, Tokyo (JP)

(73) Assignee: Disco Corporation, Tokyo (JP)

( * ) Notice: Subject to any disclaimer, the term of this patent is extended or adjusted under 35 U.S.C. 154(b) by 70 days.

(21) Appl. No.: 10/793,753

(22) Filed: Mar. 8, 2004

(65) Prior Publication Data

US 2004/0180473 A1 Sep. 16, 2004

(30) Foreign Application Priority Data

Mar. 11, 2003 (JP) ............................. 2003-064651

(51) Int. Cl.
*H01L 21/78* (2006.01)
*B26D 3/00* (2006.01)

(52) U.S. Cl. .................. 438/463; 438/464; 83/861

(58) Field of Classification Search ................ None
See application file for complete search history.

(56) References Cited

U.S. PATENT DOCUMENTS

| | | | | |
|---|---|---|---|---|
| 5,316,853 | A * | 5/1994 | Shibata et al. | 428/416 |
| 5,863,813 | A * | 1/1999 | Dando | 438/114 |
| 6,074,896 | A * | 6/2000 | Dando | 438/114 |
| 6,344,402 | B1 * | 2/2002 | Sekiya | 438/460 |
| 6,345,616 | B1 * | 2/2002 | Umahashi | 125/13.01 |
| 6,451,671 | B1 * | 9/2002 | Yamada | 438/460 |
| 6,514,795 | B1 * | 2/2003 | Jiang et al. | 438/113 |
| 6,716,674 | B1 * | 4/2004 | Yajima et al. | 438/118 |
| 6,726,526 | B1 * | 4/2004 | Sekiya et al. | 451/5 |
| 6,730,595 | B1 * | 5/2004 | Saimoto et al. | 438/654 |
| 6,774,496 | B1 * | 8/2004 | Yajima et al. | 257/783 |
| 6,780,091 | B1 * | 8/2004 | Mizomoto et al. | 451/67 |
| 6,827,636 | B1 * | 12/2004 | Yamada | 451/65 |
| 6,869,830 | B1 * | 3/2005 | Nanjo | 438/113 |
| 6,896,760 | B1 * | 5/2005 | Connell et al. | 156/249 |
| 6,901,924 | B1 * | 6/2005 | Saito | 125/13.01 |
| 6,939,785 | B1 * | 9/2005 | Kajiyama et al. | 438/463 |
| 2005/0003577 | A1 * | 1/2005 | Yajima et al. | 438/106 |

FOREIGN PATENT DOCUMENTS

| | | | | |
|---|---|---|---|---|
| JP | 63148655 | A | * | 6/1988 |
| JP | 02265258 | A | * | 10/1990 |
| JP | 04330766 | A | * | 11/1992 |
| JP | 6-120334 | | | 4/1994 |
| JP | 11204551 | A | * | 7/1999 |

\* cited by examiner

*Primary Examiner*—Alonzo Chambliss
(74) *Attorney, Agent, or Firm*—Smith, Gambrell & Russell, LLP (57) ABSTRACT

A method of dividing a semiconductor wafer comprising:
a bonding film adhering step of adhering a bonding film for die bonding to the back surface of the semiconductor wafer;
a protective adhesive tape affixing step of affixing an extensible protective adhesive tape to the bonding film side of the semiconductor wafer having the bonding film on the back surface;
a dividing step of dividing the semiconductor wafer affixed to the protective adhesive tape into individual semiconductor chips by applying a laser beam along the streets;
a bonding film breaking step of breaking the bonding film for every semiconductor chip by extending the protective adhesive tape so as to give tensile force to the bonding film; and
a semiconductor chip removing step of removing the semiconductor chips having the broken bonding film from the protective adhesive tape.

5 Claims, 7 Drawing Sheets

METHOD OF DIVIDING A SEMICONDUCTOR WAFER

FIELD OF THE INVENTION

The present invention relates to a method of dividing a semiconductor wafer having a plurality of streets formed on the front surface in a lattice form and a circuit formed in a plurality of areas sectioned by the plurality of streets into individual semiconductor chips.

DESCRIPTION OF THE PRIOR ART

In the production process of semiconductor devices, for example, semiconductor chips are manufactured by forming a circuit such as IC, LSI or the like in a large number of areas sectioned by streets (cutting lines) formed on the front surface of a substantially disk-like semiconductor wafer in a lattice form and by dividing the areas having the circuit formed therein along the streets. A dicing machine is generally used as the dividing machine for dividing a semiconductor wafer, and the dicing machine cuts a semiconductor wafer with a cutting blade having a thickness of about 20 μm. These semiconductor chips are packaged, and widely used in electric appliances such as cellular telephones and personal computers.

A bonding film for die bonding, having a thickness of 20 to 40 μm and made from a polyimide resin and the like is adhered to the back surfaces of the semiconductor chips so that the semiconductor chips can be bonded to a wiring frame for supporting semiconductor chips through the bonding film by heating. To adhere the bonding film for die bonding to the back surfaces of the semiconductor chips, the bonding film is adhered to the back surface of the semiconductor wafer, and the semiconductor wafer is cut with a cutting blade along the streets formed on the front surface, together with the bonding film to form semiconductor chips having the bonding film on the back surfaces adhered thereto. Since the bonding film for die bonding is already adhered to the back surfaces of the semiconductor chips when the semiconductor chips are to be bonded to the wring frame for supporting semiconductor chips, a bonding work is carried out smoothly.

However, since chippings or crackings are produced on the cut surface of the semiconductor chip at the time when the semiconductor wafer is cut with the cutting blade as described above, the width of each street is set to about 50 μm in consideration of the influence of nicks or cracks. Therefore, when the size of each semiconductor chip is reduced, the proportion of the streets in the semiconductor chip increases, thereby causing a reduction in productivity. Further, cutting with a cutting blade involves problems that there is limitation to the feed rate and that the semiconductor chips are contaminated by cut chippings.

Meanwhile, attempts have been made to cut a semiconductor wafer by applying a laser beam along streets as disclosed by JP-A 6-120334, for example.

In the method of cutting a semiconductor wafer by using a laser beam, there is no influence of nicks or cracks, no cut chippings are produced, and the feed rate can be accelerated because the semiconductor wafer is cut by applying a laser beam along the streets.

When the semiconductor wafer is to be divided into individual semiconductor chips by applying a laser beam to it along the streets, a laser beam having relatively low output is used so that circuits formed on the semiconductor wafer do not suffer damage by heat. Accordingly, this involves a problem that a bonding film for die bonding adhered to the back surface of the semiconductor wafer cannot be divided together with the semiconductor wafer.

SUMMARY OF THE INVENTION

It is an object of the present invention to provide a method of dividing a semiconductor wafer, capable of separating individual semiconductor chips from one another by breaking a bonding film for die bonding corresponding to the semiconductor chips after the semiconductor wafer is divided into the semiconductor chips by applying a laser beam along the streets of the semiconductor wafer having a bonding film for die bonding adhered to the back surface thereof.

To attain the above object, according to the present invention, there is provided a method of dividing a semiconductor wafer having a plurality of streets formed on the front surface in a lattice form and a circuit formed in a plurality of areas sectioned by the plurality of streets, into individual semiconductor chips, comprising:

a bonding film adhering step of adhering a bonding film for die bonding to the back surface of the semiconductor wafer;

a protective adhesive tape affixing step of affixing an extensible protective adhesive tape on the side of the bonding film of the semiconductor wafer having the bonding film adhered to the back surface thereof;

a dividing step of dividing the semiconductor wafer into individual semiconductor chips by applying a laser beam along the streets from the front surface of the semiconductor wafer affixed to the protective adhesive tape;

a bonding film breaking step of breaking the bonding film for every semiconductor chip by extending the protective adhesive tape to give tensile force to the bonding film; and a semiconductor chip removing step of removing the semiconductor chips having the broken bonding film affixed thereto from the protective adhesive tape.

The above bonding film adhering step is carried out by placing the above bonding film on the back surface of the semiconductor wafer and pressing the bonding film against the back surface of the semiconductor wafer under heating at a temperature of 80 to 200° C. The above protective adhesive tape is adhered so as to cover the inner opening of an annular support frame. Further, it is desirable that the above protective adhesive tape has a property that its adhesion is reduced by an external stimulus, and the external stimulus is given to the protective adhesive tape to reduce its adhesion at the time to remove the semiconductor chips having the bonding film affixed thereto from the protective adhesive tape in the above semiconductor chip removing step.

DETAILED DESCRIPTION OF THE PREFERRED EMBODIMENTS

The method of dividing a semiconductor wafer according to a preferred embodiment of the present invention will be described in detail with reference to the accompanying drawings.

Figure 1:
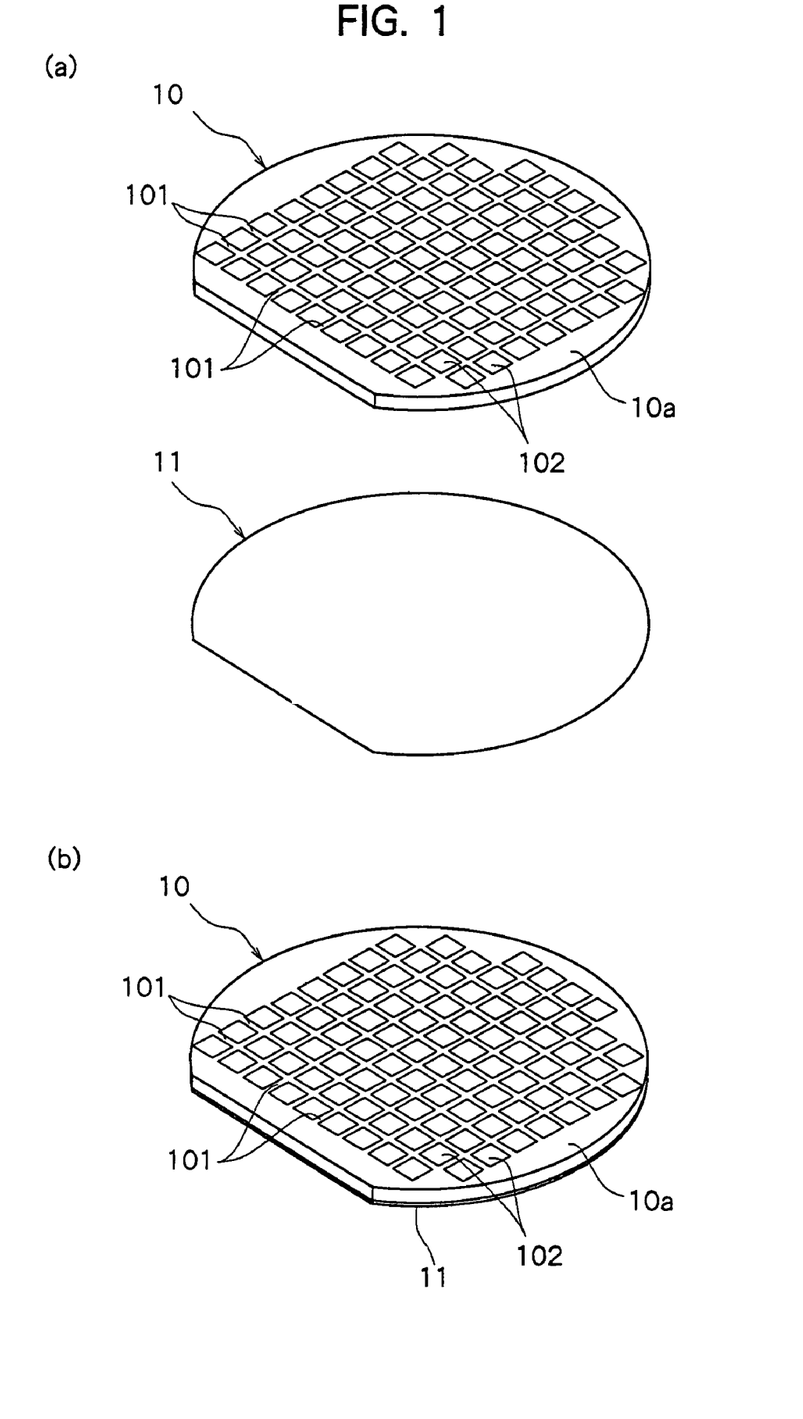
FIGS. 1(a) and 1(b) are diagrams showing the bonding film adhering step for adhering a bonding film for die bonding to the back surface of a semiconductor wafer in the dividing method according to the present invention.

FIGS. 1(a) and 1(b) are diagrams showing an example of the bonding film adhering step of adhering a bonding film for die bonding to the back surface of a semiconductor wafer in the dividing method of the present invention.

FIG. 1(a) is a perspective view of a semiconductor wafer 10 and a bonding film 11 for die bonding to be adhered to the back surface of the semiconductor wafer 10. A plurality of streets 101 are formed on the front surface 10a of the semiconductor wafer 10 in a lattice form, and a circuit 102 is formed in a plurality of areas sectioned by the plurality of streets 101. A film material that is made from a polyimide resin and has a thickness of 20 to 40 µm may be used as the bonding film 11 for die bonding. This bonding film 11 for die bonding is placed on the back surface of the semiconductor wafer 10 and pressed against the back surface of the semiconductor wafer 10 under heating at 80 to 200° C. to be adhered to the back surface of the semiconductor wafer 10 as shown in FIG. 1(b). The bonding film for die bonding is easily broken by applying relatively small tensile force.

Figure 2:
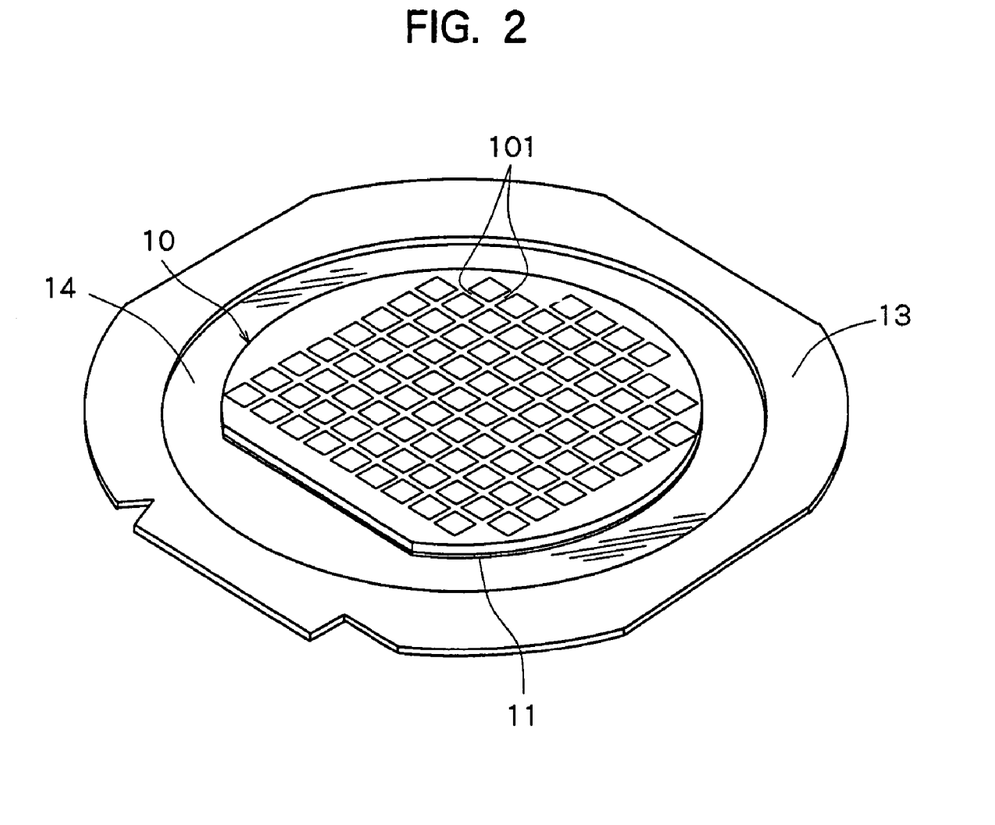
FIG. 2 is a perspective view showing a state of an extensible protective adhesive tape being affixed on the side of the bonding film of a semiconductor wafer having a bonding film adhered to the back surface thereof in the protective adhesive tape affixing step in the dividing method according to the present invention.

After the bonding film 11 is adhered to the back surface of the semiconductor water 10 in the above bonding film adhering step, an extensible protective adhesive tape is affixed to the side of the bonding film 11 adhered to the back surface of the semiconductor wafer 10 (protective adhesive tape affixing step). This protective adhesive tape affixing step is to affix the bonding film 11 adhered to the back surface of the semiconductor wafer 10 to the top surface of the extensible protective adhesive tape 14 which is a synthetic resin tape such as a vinyl chloride tape generally used as a dicing tape and adhered so as to cover the inner opening of an annular support frame 13 as shown in FIG. 2. A UV tape having the property that its adhesion is reduced by an external stimulus such as ultraviolet radiation or the like is used as the extensible protective adhesive tape 14.

After the bonding film 11 adhered to the back surface of the semiconductor wafer 10 is affixed to the top surface of the extensible protective adhesive tape 14 adhered on the support frame 13 in the protective adhesive tape affixing step, the dividing step of dividing the semiconductor wafer 10 having the protective adhesive tape 14 affixed thereto into individual semiconductor chips by applying a laser beam along the streets 101 is carried out.

A laser beam machine for carrying out the dividing step for dividing the semiconductor wafer 10 into individual semiconductor chips by applying a laser beam along the streets 101 will be described with reference to FIGS. 3 and 4.

Figure 3:
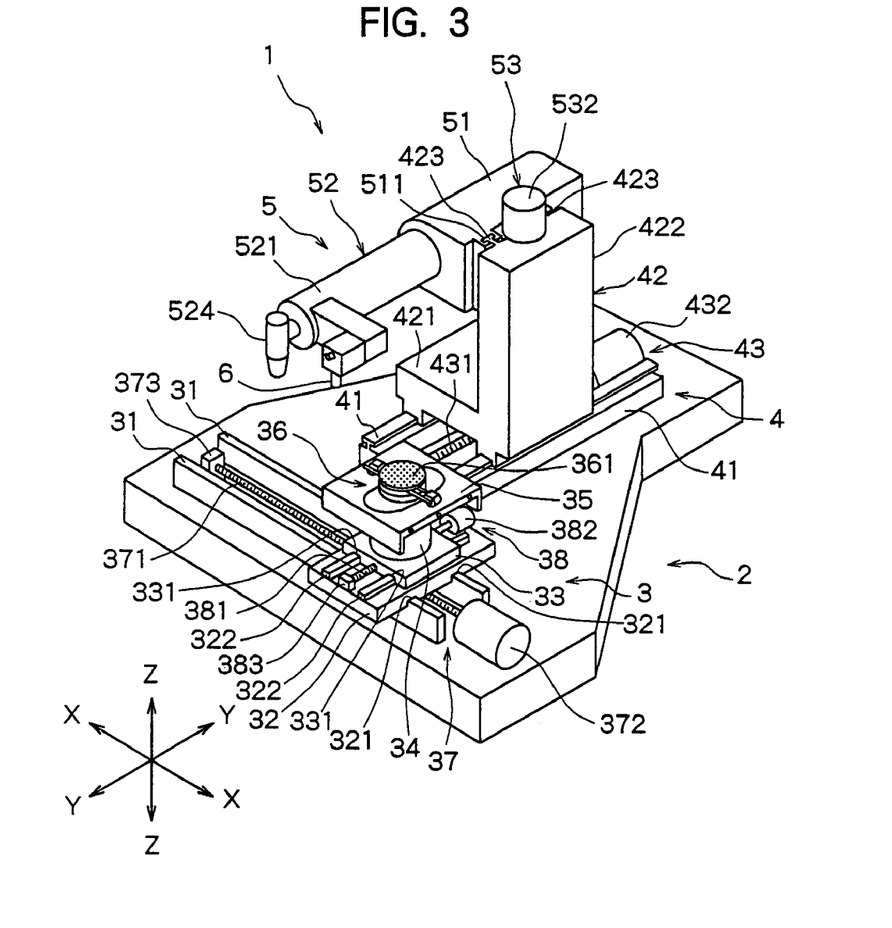
FIG. 3 is a perspective view showing an example of a laser beam machine for carrying out the dividing step in the dividing method according to the present invention.
Figure 4:
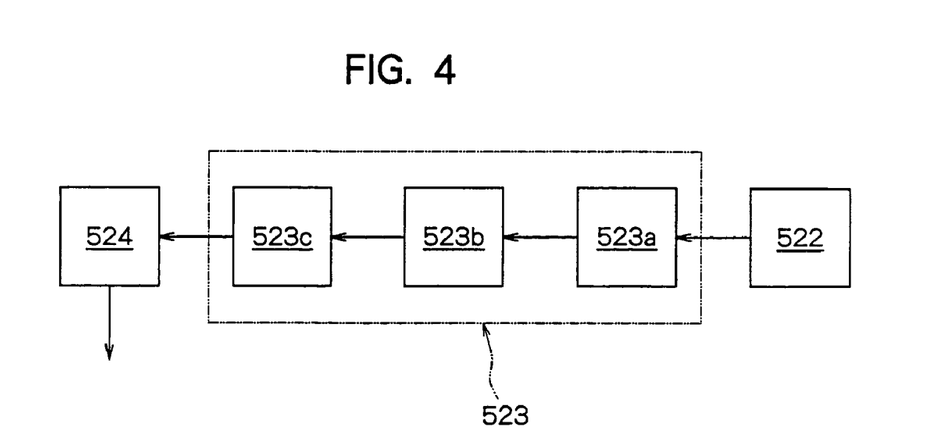
FIG. 4 is a block diagram schematically showing the constitution of a laser beam application means provided in the laser beam machine shown in FIG. 3.

The laser beam machine 1 shown in FIG. 3 comprises a static base 2, a chuck table unit 3 which is disposed on the static base 2 in such a manner that it can move in a direction shown by an arrow X and holds a workpiece, a laser beam application unit support mechanism 4 which is mounted on the static base 2 in such a manner that it can move in a direction shown by an arrow Y perpendicular to the above direction shown by the arrow X, and a laser beam application unit 5 which is disposed on the laser beam application unit support mechanism 4 in such a manner that it can move in a direction shown by an arrow Z.

The above chuck table mechanism 3 comprises a pair of guide rails 31 and 31 mounted on the static base 2 and arranged parallel to each other in the direction shown by the arrow X, a first sliding block 32 mounted on the guide rails 31 and 31 in such a manner that it can move in the direction shown by the arrow X, a second sliding block 33 mounted on the first sliding block 32 in such a manner that it can move in the direction shown by the arrow Y, a support table 35 supported on the second sliding block 33 by a cylindrical member 34, and a chuck table 36 as a workpiece holding means. This chuck table 36 has an adsorption chuck 361 made of a porous material so that a disk-like semiconductor wafer as a workpiece is held on the adsorption chuck 361 by a suction means that is not shown. The chuck table 36 is rotated by a pulse motor (not shown) installed in the cylindrical member 34.

The above first sliding block 32 has, on its under surface, a pair of to-be-guided grooves 321 and 321 which are fitted to the above pair of guide rails 31 and 31 and, on its top surface, a pair of guide rails 322 and 322 formed parallel to each other in the direction shown by the arrow Y. The first sliding block 32 thus constituted can move in the direction shown by the arrow X along the pair of guide rails 31 and 31 by fitting the to-be-guided grooves 321 and 321 to the pair of guide rails 31 and 31. The chuck table mechanism 3 in the illustrated embodiment is provided with a moving means 37 for moving the first sliding block 32 along the pair of guide rails 31 and 31 in the direction shown by the arrow X. The moving means 37 includes a male screw rod 371 arranged, in parallel to, between the above pair of guide rails 31 and 31 and a drive source such as a pulse motor 372 for rotationally driving the male screw rod 371. The male screw rod 371 is, at its one end, rotatably supported to a bearing block 373 fixed to the above static base 2 and is, at the other end, transmission-coupled with the output shaft of the above pulse motor 372 via a speed reducer (not shown). The male screw rod 371 is screwed into a threaded through-hole formed in a female screw block (not shown) projecting from the under surface of the center portion of the first sliding block 32. Therefore, by driving the male screw rod 371 in a normal direction or reverse direction by the pulse motor 372, the first sliding block 32 is moved along the guide rails 31 and 31 in the direction shown by the arrow X.

The above second sliding block 33 has, on its under surface, a pair of to-be-guides grooves 331 and 331 which are fitted to the pair of guide rails 322 and 322 provided on the top surface of the above first sliding block 32 and can be moved in the direction shown by the arrow Y by fitting the to-be-guided grooves 331 and 331 to the pair of guide rails 322 and 322. The chuck table mechanism 3 in the illustrated embodiment is provided with a moving means 38 for moving the second sliding block 33 in the direction shown by the arrow Y along the pair of guide rails 322 and 322 provided on the first sliding block 32. The moving means 38 includes a male screw rod 381 that is arranged, in parallel to, between the above pair of guide rails 322 and 322 and a drive source such as a pulse motor 382 for rotationally driving the male screw rod 381. The male screw rod 381 is, at its one end, rotatably supported to a bearing block 383 fixed on the top surface of the above first sliding block 32 and is, at the other end, transmission-coupled with the output shaft of the above pulse motor 382 via a speed reducer that is not shown. The male screw rod 381 is screwed into a threaded through-hole formed in a female screw block (not shown) projecting from the under surface of the center portion of the second sliding block 33. Therefore, by driving the male screw rod 381 in a normal direction or reverse direction by the pulse motor 382, the second sliding block 33 is moved along the guide rails 322 and 322 in the direction shown by the arrow Y.

The above laser beam application unit support mechanism 4 comprises a pair of guide rails 41 and 41 mounted on the static base 2 and arranged parallel to each other in the indexing direction shown by the arrow Y and a movable support base 42 mounted on the guide rails 41 and 41 in such a manner that it can move in the direction shown by the arrow Y. This movable support base 42 comprises a movable support portion 421 movably disposed on the guide rails 41 and 41 and a mounting portion 422 mounted on the movable support portion 421. The mounting portion 422 has, on its one side, a pair of guide rails 423 and 423 extending in the direction shown by the arrow Z. The laser beam application unit support mechanism 4 in the illustrated embodiment comprises a moving means 43 for moving the movable support base 42 along the pair of guide rails 41 and 41 in the indexing direction shown by the arrow Y. The moving means 43 comprises a male screw rod 431 that is arranged, in parallel to, between the above pair of guide rails 41 and 41 and a drive source such as a pulse motor 432 for rotationally driving the male screw rod 431. The male screw rod 431 is, at its one end, rotatably supported to a bearing block (not shown) fixed on the above static base 2 and is, at the other end, transmission-coupled with the output shaft of the above pulse motor 432 via a speed reducer that is not shown. The male screw rod 431 is screwed into a threaded through-hole formed in a female screw block (not shown) projecting from the under surface of the center portion of the movable support portion 421 constituting the movable support base 42. Thereby, by driving the male screw rod 431 in a normal direction or reverse direction by the pulse motor 432, the movable support base 42 is moved along the guide rails 41 and 41 in the indexing direction shown by the arrow Y.

The laser beam application unit 5 in the illustrated embodiment comprises a unit holder 51 and a laser beam application means 52 secured to the unit holder 51. The unit holder 51 is provided with a pair of to-be-guided grooves 511 and 511 to be slidably fitted to the pair of guide rails 423 and 423 provided on the above mounting portion 422 and is supported in such a manner that it can be moved in the direction shown by the arrow Z by fitting the to-be-guided grooves 511 and 511 to the above guide rails 423 and 423.

The illustrated laser beam application means 52 comprises a cylindrical casing 521 secured to the above unit holder 51 and extending substantially horizontally. In the casing 521, there are installed a laser beam oscillation means 522 and a laser beam modulation means 523 as shown in FIG. 4. A YAG laser oscillator or YVO4 laser oscillator may be used as the laser beam oscillation means 522. The laser beam modulation means 523 comprises a repetition frequency setting means 523a, a laser beam pulse width setting means 523b and a laser beam wavelength setting means 523c. The repetition frequency setting means 523a, laser beam pulse width setting means 523b and laser beam wavelength setting means 523c constituting the laser beam modulation means 523 may be known devices to people of ordinary skill in the art and therefore, detailed descriptions of their structures are omitted in this text. A condenser 524 is attached to the end of the above casing 521.

A laser beam oscillated from the above laser beam oscillation means 522 reaches the condenser 524 through the laser beam modulation means 523. The repetition frequency setting means 523a of the laser beam modulation means 523 changes the laser beam into a pulse laser beam having a predetermined repetition frequency, the laser beam pulse width setting means 523b changes the pulse width of the pulse laser beam to a predetermined width, and the laser beam wavelength setting means 523c changes the wavelength of the pulse laser beam to a predetermined value.

An image pick-up means 6 is situated at the front end of the casing 521 constituting the above laser beam application means 52. This image pick-up means 6 comprises an image pick-up device (CCD) for picking up an image of the workpiece, an illuminating means for illuminating the workpiece and an optical system for capturing an area illuminated by the illuminating means, and is so constituted to transmit an image picked up by the optical system to the image pick-up device (CCD) to convert it into an electrical image signal. This image signal is transmitted to a control means that is not shown.

The laser beam application unit 5 in the illustrated embodiment comprises a moving means 53 for moving the unit holder 51 along the pair of guide rails 423 and 423 in the direction shown by the arrow Z. The moving means 53 comprises a male screw rod (not shown) arranged between the pair of guide rails 423 and 423 and a drive source such as a pulse motor 532 for rotationally driving the male screw rod, like the above-mentioned moving means. By driving the male screw rod (not shown) in a normal direction or reverse direction by the pulse motor 532, the unit holder 51 and the laser beam application means 52 are moved along the guide rails 423 and 423 in the direction shown by the arrow Z.

A description is subsequently given of the dividing step of dividing the semiconductor wafer 10 supported on the protective adhesive tape 14 mounted to the support frame 13, into individual semiconductor chips by using the above-described laser beam machine 1.

The semiconductor wafer 10 supported on the protective adhesive tape 14 mounted to the support frame 13 is carried onto the adsorption chuck 361 of the chuck table 36 constituting the chuck table mechanism 3 of the laser beam machine 1 shown in FIG. 3 with the front surface 10a facing up, and suction-held on the adsorption chuck 361. The chuck table 36 thus suction-holding the semiconductor wafer 10 is moved along the guide rails 31 and 31 by the operation of the moving means 37 to be brought to a position right below the image pick-up means 6 mounted to the laser beam application unit 5.

When the chuck table 36 is positioned right below the image pick-up means 6, image processing such as pattern matching is carried out by the image pick-up means 6 and control means (not shown) in order to align streets 101 in a first direction formed on the semiconductor wafer 10 with the condenser 524 of the laser beam application unit 5 for applying a laser beam along the street 101. The alignment of a laser beam application position is thus carried out. The alignment of a laser beam application position is also carried out on streets 101 in a second direction formed on the semiconductor wafer 10.

After a street 101 formed on the semiconductor wafer 10 held on the chuck table 36 is detected and the alignment of the laser beam application position is carried out, the chuck table 36 is moved to a laser beam application area where the condenser 524 of the laser beam application unit 5 for applying a laser beam is situated, and a laser beam is applied along the street 101 of the semiconductor wafer 10 from the condenser 524 of the laser beam application unit 5 in the laser beam application area. On this occasion, the laser beam is brought to focus on the interior of the semiconductor wafer 10 through the front surface 10a of the semiconductor wafer 10 so as to form a modified layer along the street 101 in the interior of the semiconductor wafer 10.

Figure 5:
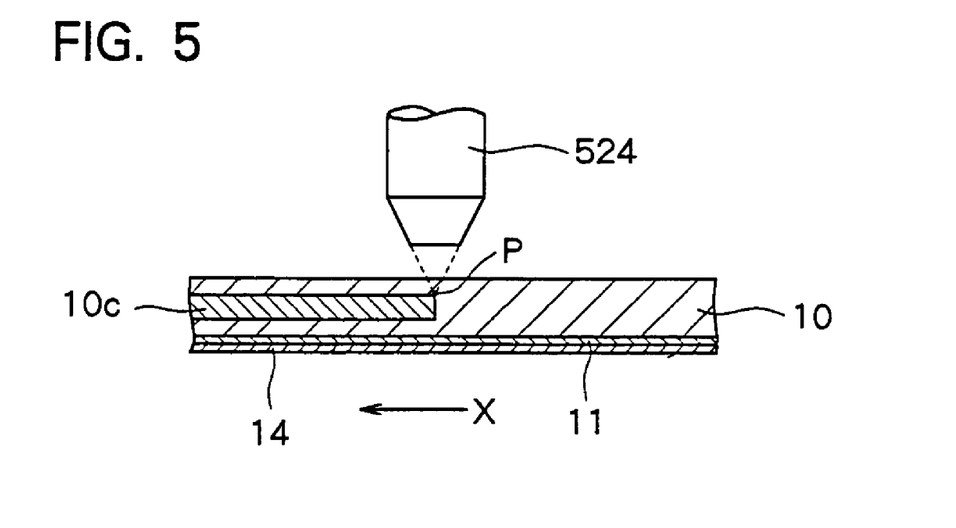
FIG. 5 is an enlarged sectional view showing an example of the dividing step in the dividing method according to the present invention.

In the step of forming modified layers along the streets 101 in the interior of the semiconductor wafer 10, the chuck table 36, that is, the semiconductor wafer 10 held on the chuck table 36 is moved at a predetermined feed rate (for example, 100 mm/sec) in the direction shown by the arrow X while a pulse laser beam is applied to a predetermined street 101 on the semiconductor wafer 10 from the condenser 524 of the laser beam application unit 5 for irradiating a laser beam. In the step of forming modified layers, the following laser beam is irradiated as the laser beam.
light source: YAG laser or YVO4 laser
wavelength: 1,064 nm (infrared laser beam)
output: 5.1 W
repetition frequency: 100 kHz
pulse width: 20 ns
focal spot diameter: 1 µm As the laser beam irradiated in the step of forming modified layers is used an infrared laser beam having a long wavelength, the laser beam is applied to the front surface of the semiconductor wafer 10 upon focusing on the interior of the semiconductor wafer 10 as shown in FIG. 5. For example, in the case of a semiconductor wafer 10 having a thickness of about 100 µm, the semiconductor wafer 10 is moved in the direction shown by the arrow X while an infrared laser beam is applied upon focusing on the interior of about 20 µm from the front surface, so that a modified area 10c having a depth of about 50 µm is continuously formed along the street in the interior of the semiconductor wafer 10.

Since the semiconductor wafer 10 having the modified layers 10c formed along the streets in its interior in the above step of forming modified layers is broken at the modified layers 10c as the starting points when external force is exerted thereon, it can be easily broken with small external force. In this case, the bonding film 11 for die bonding adhered to the back surface of the semiconductor wafer 10 is not broken because the laser beam applied in the above step of forming modified layers 10c does not reach the bonding film 11.

Another example of the method of applying a laser beam will be described next.

Figure 6:
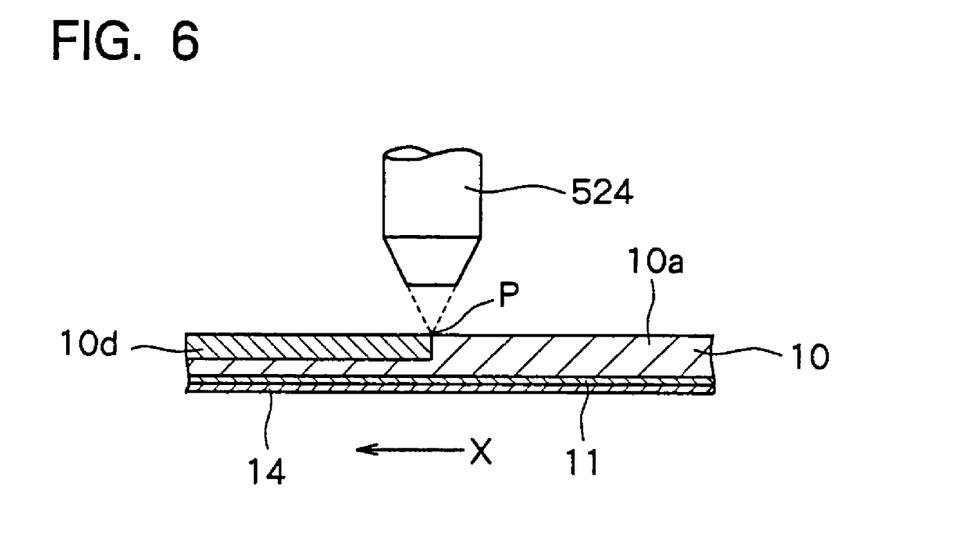
FIG. 6 is an enlarged sectional view showing another example of the dividing step in the diving method according to the present invention.

In this example, the chuck table 36 is moved to the laser beam application area where the condenser 524 of the laser beam application unit 5 for applying a laser beam is situated as described above, and a laser beam is applied along a street 101 on the semiconductor wafer 10 from the condenser 524 of the laser beam application unit 5 in the laser beam application area by focusing on the front surface 10a of the semiconductor wafer 10 to form a grooving line.

The step of forming grooving lines will be described hereinunder.

In the step of forming grooving lines, the chuck table 36, that is, the semiconductor wafer 10 held on the chuck table 36 is moved at a predetermined feed rate (for example, 150 mm/sec) in the direction shown by the arrow X while a pulse laser beam is applied from the condenser 524 of the laser beam application unit 5 for applying a laser beam upon focusing on the front surface 10a of a predetermined street 101 on the semiconductor wafer 10. In the step of forming grooving lines, the following laser beam is irradiated as the laser beam.
light source: YAG laser or YVO4 laser
wavelength: 355 nm (ultraviolet laser beam)
output: 3.0 W
repetition frequency: 20 kHz
pulse width: 0.1 ns
focal spot diameter: 5 µm A laser beam having a short wavelength is used as the laser beam in this example but an infrared laser beam may be used. By moving a laser beam in the direction shown by the arrow X while its focal point P is set to the front surface 10a of the semiconductor wafer 10, a grooving line 10d having a depth of about 30 µm is formed along the street.

Since the semiconductor wafer 10 having grooving lines 10d along the streets in the above step of forming grooving lines is broken with the grooving lines 10d as the starting points, it is divided into individual semiconductor chips along the streets by exerting small external force thereon. The bonding film 11 for die bonding adhered to the back surface of the semiconductor wafer 10 is not broken because a laser beam applied in the above step of forming grooving lines does not reach the bonding film 11.

It is desired to carry out both the step of forming modified layers along the streets 101 in the interior of the semiconductor wafer 10 and the step of forming grooving lines along the streets 101 on the front surface of the semiconductor wafer 10 in the dividing step of dividing the semiconductor wafer 10 into individual semiconductor chips.

After the dividing step of dividing the semiconductor wafer 10 into individual semiconductor chips is carried out by using the laser beam machine 1, the protective adhesive tape 14 is extended to give tensile force to the bonding film 11 so as to carry out the bonding film breaking step of breaking the bonding film 11 for every semiconductor chip. This bonding film breaking step is carried out by a protective adhesive tape extending device 15 shown in FIG. 7 and FIGS. 8(a) and 8(b). The protective adhesive tape extending device 15 will be described hereinunder. The illustrated protective adhesive tape 14 extending device 15 comprises a cylindrical base 151 having a placing surface 151a for placing the above support frame 13 and an extending means 16 that is arranged concentrically in the base 151 and serves for positively extending the protective adhesive tape 14 adhered to the support frame 13. The extending means 16 has a cylindrical extending member 161 for supporting an area 141 where a plurality of semiconductor chips 20 are existent of the above protective adhesive tape 14. This extending member 161 is constituted to be able to be moved in a vertical direction (axial direction of the cylindrical base 151) between a reference position shown in FIG. 8(a) and an extending position shown in FIG. 8(b) above the reference position, by a lifting means that is not shown. In the illustrated embodiment, ultraviolet illumination lamps 17 are installed within the extending member 161.

Next, the bonding film breaking step that is carried out with the above-described protective adhesive tape extending device 15 will be described with reference to FIG. 7, FIG. 8(a) and FIG. 8(b).

Figure 7:
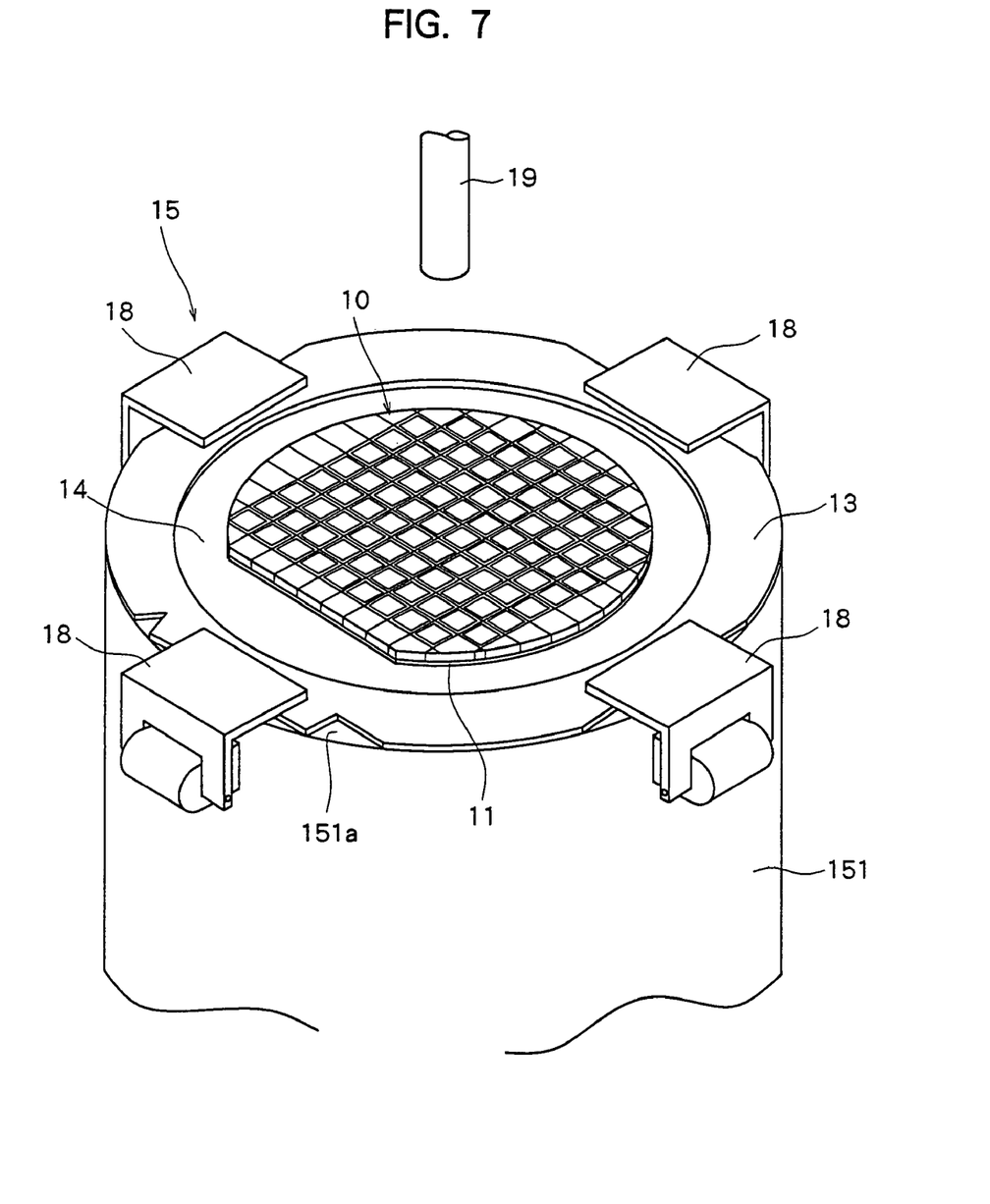
FIG. 7 is a perspective view of a protective adhesive tape extending device for carrying out the bonding film breaking step in the present invention.
Figure 8:
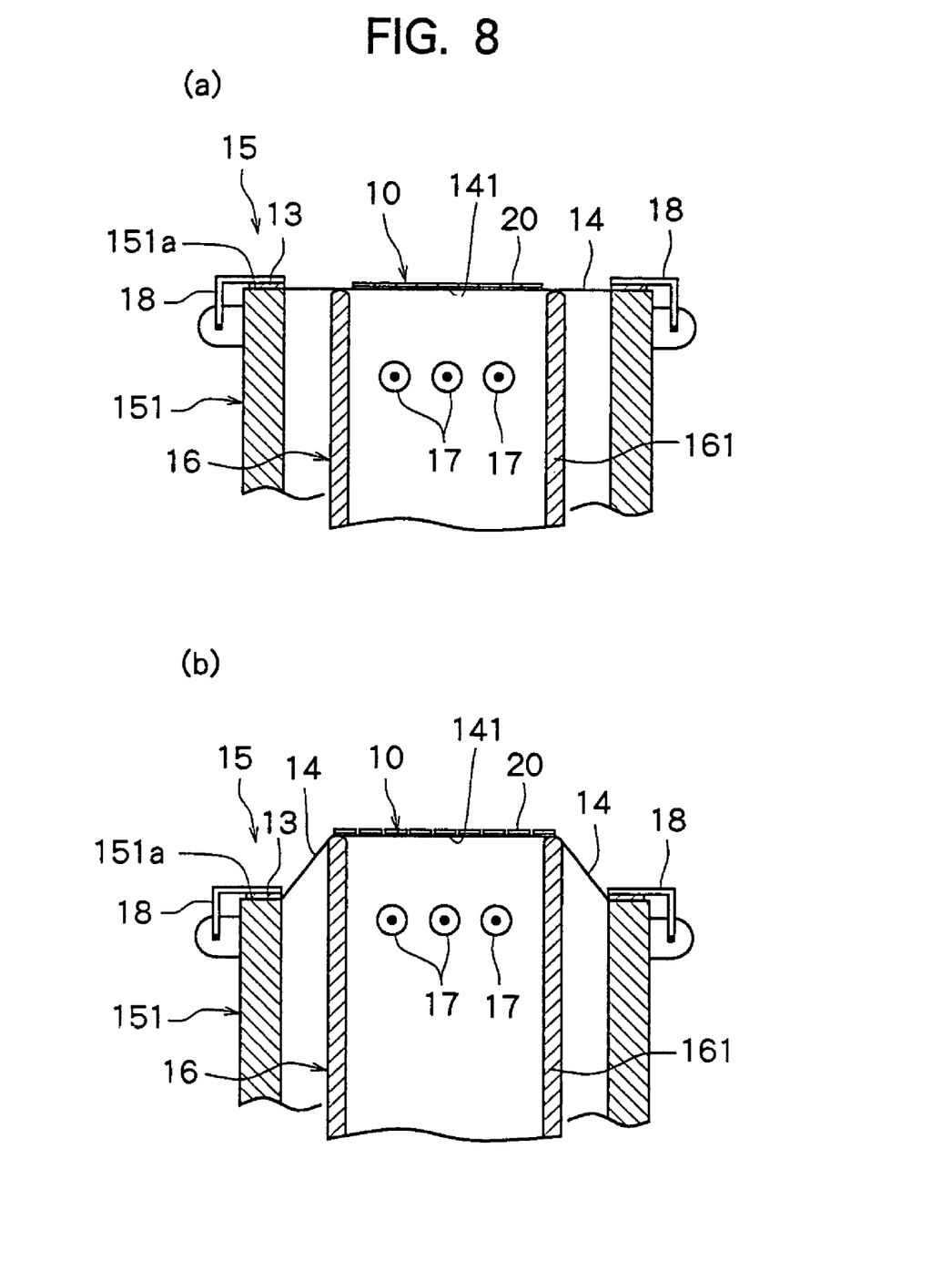
FIGS. 8(a) and 8(b) are diagrams for explaining the bonding film breaking step in the dividing method according to the present invention.
Figure 9:
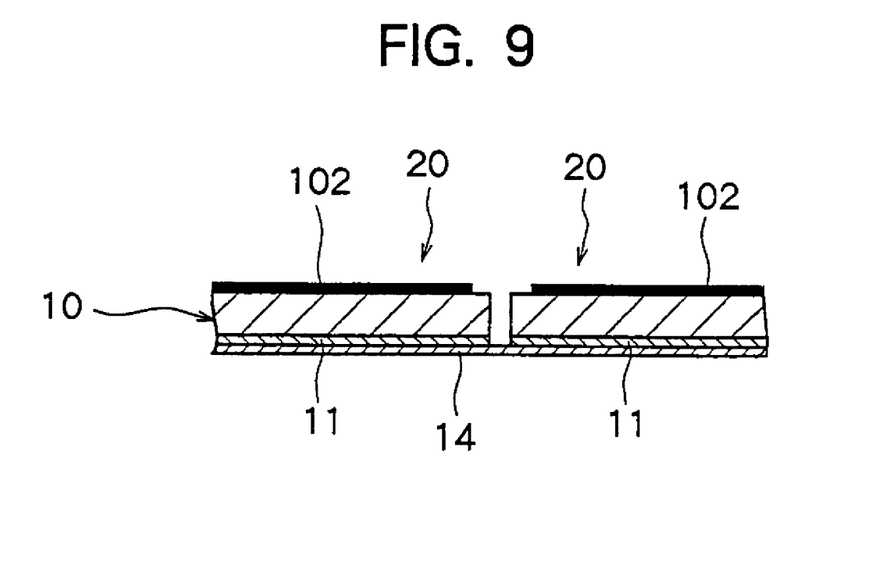
FIG. 9 is a partial enlarged sectional view of a semiconductor wafer subjected to the bonding film breaking step.

As described above, the support frame 13 supporting the semiconductor wafer 10 that has the bonding film 11 adhered to the back surface thereof and is supported on the top surface of the extensible protective adhesive tape 14 affixed to the support frame 13 (the bonding film 11 adhered to the back surface of the semiconductor wafer 10 divided into individual semiconductor chips 20 is affixed to the top of the protective adhesive tape 13) is placed on the placing surface 151a of the cylindrical base 151 and secured to the base 15 by clamps 18 as shown in FIG. 7 and FIG. 8(a). Then, as shown in FIG. 8(b), the extending member 161 of the extending means 16, which supports the area 141 where the plurality of semiconductor chips 20 exist, in the above protective adhesive tape 14 is moved to the extending position shown in FIG. 8(b) from the reference position shown in FIG. 8(a) by a lifting means that is not shown. As a result, as the extensible protective adhesive tape 14 is extended, tensile force acts on the bonding film 11 affixed to this protective adhesive tape 14, whereby the bonding film 11 is broken along the semiconductor chips 20 as shown in FIG. 9. Since adhesion between the protective adhesive tape 14 and the bonding film 11 adhered to the semiconductor chips 20 lowers due to a gap produced between them at this time, the semiconductor chips 20 adhered to the bonding film 11 are easily removed from the protective adhesive tape 14.

Figure 10:
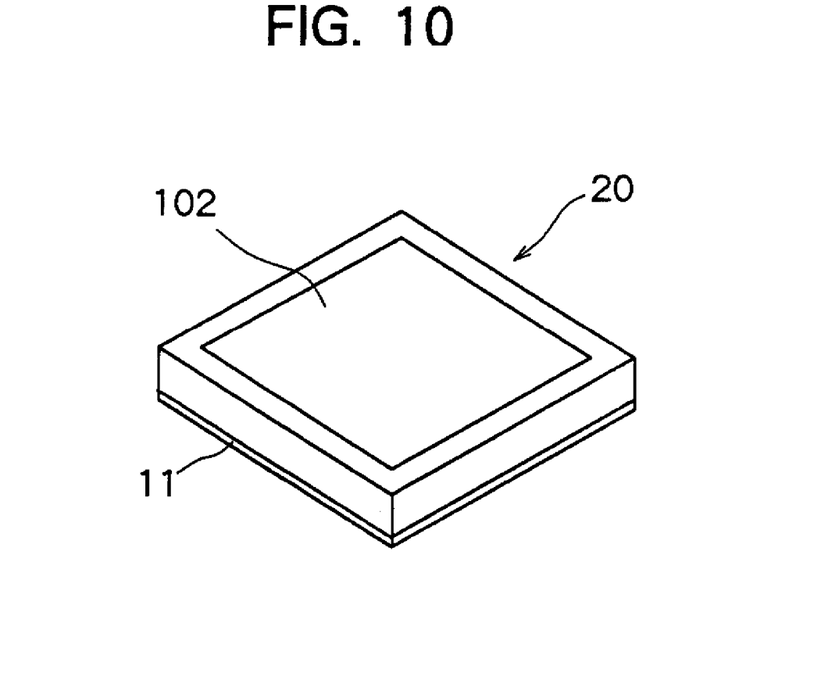
FIG. 10 is a perspective view of a semiconductor chip formed by dividing the semiconductor wafer by the dividing method according to the present invention.

After the bonding film 11 adhered to the back surface of the semiconductor wafer 10 divided into individual semiconductor chips 20 is broken along the semiconductor chips 20 in the bonding film breaking step, a chip pick-up collet 19 positioned above the protective adhesive tape extending device 15 is operated to remove the individual semiconductor chips 20 from the top surface of the protective adhesive tape 14 (semiconductor chip removing step) as shown in FIG. 7 and carry them to a tray (not shown) or carry out a die bonding step. On this occasion, the ultraviolet illumination lamps 17 installed within the extending member 161 are turned on to apply ultraviolet radiation to the protective adhesive tape 14 so as to reduce the adhesion of the protective adhesive tape 14, thereby making it possible to easily remove the semiconductor chips 20 from the protective adhesive tape 14. The semiconductor chips 20 thus removed from the protective adhesive tape 14 have a state of the bonding film 11 being still adhered to the back surface as shown in FIG. 10, and semiconductor chips 20 having the bonding film 11 adhered to the back surface are obtained. Further, since the semiconductor wafer 10 is divided compactly by a laser beam, the bonding film 11 is divided according to the size of each semiconductor chip 20 and rarely protrudes from the semiconductor chips 20 at the time of die bonding, thereby improving the quality of die bonding.

According to the method of dividing a semiconductor wafer of the present invention, the dividing step of adhering the bonding film for die bonding to the back surface of the semiconductor wafer and applying a laser beam to the semiconductor wafer is carried out to divide a semiconductor wafer into individual semiconductor chips. In this step, the bonding film is not broken but semiconductor chips having the bonding film adhered on the back surface by imparting tensile force to the bonding film and breaking it along the individual semiconductor chips. Therefore, the bonding work of the semiconductor chips can be carried out smoothly. Further, according to the method of dividing a semiconductor wafer of the present invention, as a laser beam is applied to the semiconductor wafer to divide it into individual semiconductor chips, no gap is formed between adjacent semiconductor chips, and the bonding film is broken in accord with the semiconductor chips. Therefore, the bonding film does not protrude from the semiconductor chips. Consequently, the quality of bonding the semiconductor chips to a wiring frame is improved.

I claim:

1. A method of dividing a semiconductor wafer having a plurality of streets formed on the front surface in a lattice form and a circuit formed in a plurality of areas sectioned by the plurality of streets into individual semiconductor chips, comprising:

a bonding film adhering step of adhering a bonding film for die bonding to the back surface of the semiconductor wafer;

a protective adhesive tape affixing step of affixing an extensible protective adhesive tape to the bonding film;

a dividing step of dividing the semiconductor wafer into individual semiconductor chips without dividing the bonding film by applying a laser beam along the streets from the front surface of the semiconductor wafer affixed to the protective adhesive tape;

a bonding film breaking step of breaking the bonding film for every semiconductor chip by extending the protective adhesive tape so as to give tensile force to the bonding film; and a semiconductor wafer removing step of removing the semiconductor chips having the broken bonding film affixed thereto from the protective adhesive tape.

2. The method of dividing a semiconductor wafer according to claim 1, wherein the bonding film adhering step is carried out by placing the bonding film on the back surface of the semiconductor wafer and pressing the bonding film against the back surface of the semiconductor wafer under heating at a temperature of 80 to 200° C.

3. The method of dividing a semiconductor wafer according to claim 1 or 2, wherein the protective adhesive tape is adhered so as to cover the inner opening of an annular support frame.

4. The method of dividing a semiconductor wafer according to claim 3, wherein the protective adhesive tape has a property that its adhesion is reduced by an external stimulus, and an external stimulus is given to the protective adhesive tape to reduce its adhesion at the time to remove the semiconductor chips having the bonding film affixed thereto from the protective adhesive tape in the above semiconductor chips removing step.

5. The method of dividing a semiconductor wafer according to claim 1 or 2, wherein the protective adhesive tape has a property that its adhesion is reduced by an external stimulus, and an external stimulus is given to the protective adhesive tape to reduce its adhesion at the time to remove the semiconductor chips having the bonding film affixed thereto from the protective adhesive tape in the above semiconductor chips removing step.

* * * * *